(12) United States Patent  
DeMoss (10) Patent No.: US 8,233,644 B2
(45) Date of Patent: Jul. 31, 2012

(54) MULTIPLE FAN ACOUSTIC INTERACTION CONTROL

(75) Inventor: Jeffrey DeMoss, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 1090 days.

(21) Appl. No.: 12/134,831

(22) Filed: Jun. 6, 2008

(65) Prior Publication Data

US 2009/0304199 A1    Dec. 10, 2009

(51) Int. Cl.
*G09F 27/00* (2006.01)
(52) U.S. Cl. ....... 381/124; 381/71.3; 700/304; 388/838; 388/827; 361/688; 361/697; 361/695
(58) Field of Classification Search ............... 381/124, 381/71.1–71.3; 388/838, 827; 700/304; 318/473, 268, 67; 361/688, 697, 695, 818
See application file for complete search history.

(56) References Cited

U.S. PATENT DOCUMENTS

| | | | |
|---|---|---|---|
| 5,148,402 A * | 9/1992 | Magliozzi et al. | 700/280 |
| 5,789,678 A * | 8/1998 | Pla | 73/660 |
| 6,398,505 B1 * | 6/2002 | Sekiguchi | 417/2 |
| 6,617,815 B1 | 9/2003 | Krief | |
| 6,924,568 B2 | 8/2005 | Dhuey | |
| 7,245,095 B2 | 7/2007 | Hsu | |
| 7,253,542 B2 | 8/2007 | Dhuey | |
| 2006/0103334 A1 * | 5/2006 | Abali et al. | 318/67 |
| 2007/0219756 A1 * | 9/2007 | Frankel et al. | 702/188 |
| 2009/0002939 A1 * | 1/2009 | Baugh et al. | 361/687 |
| 2009/0167228 A1 * | 7/2009 | Chung et al. | 318/455 |

* cited by examiner

*Primary Examiner* — Devona Faulk
*Assistant Examiner* — Disler Paul
(74) *Attorney, Agent, or Firm* — Haynes and Boone, LLP (57) ABSTRACT

A fan control system includes a controller that is coupled to a plurality of fan couplers. A computer-readable medium is coupled to the controller and includes a first fan identification corresponding to a first fan, a second fan identification corresponding to a second fan, and at least one fan property associated with each of the first fan identification and the second fan identification. The controller is operable to monitor at least one operating parameter of each of the first fan and the second fan when the first fan and the second fan are coupled to a respective fan coupler. The controller is further operable to use the at least one fan property associated with each of the first fan identification and the second fan identification and the at least one operating parameter of each of the first fan and the second fan in order to adjust a speed of the second fan relative to a speed of the first fan.

21 Claims, 5 Drawing Sheets

| FAN ID 264 | FAN BLADES 266 | MOTOR PULSES 268 | ACOUSTIC PRIORITY 270 | FAN SPEED (RPM) 272 | BLADE FREQUENCY (Hz) 274 | PULSE FREQUENCY (Hz) 276 |
|---|---|---|---|---|---|---|
| 210 | 7 | 4 | 2 | 2000 | 233 | 133 |
| 212 | 7 | 4 | 1 | 2100 | 245 | 140 |
| 218 | 7 | 4 | 3 | 1900 | 222 | 127 |
| 220 | 7 | 4 | 4 | 2500 | 291 | 167 |
| N | | | | | | |

MULTIPLE FAN ACOUSTIC INTERACTION CONTROL

BACKGROUND

The present disclosure relates generally to information handling systems, and more particularly to a control to address acoustic interactions between multiple fans in an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs such as, for example, server and/or workstation systems, often include a plurality of fans in order to address the cooling requirements of the system. The IHSs will often use the same or similar fans in cooling arrays in order to simplify manufacture and reduce costs. The use of the same or similar fans in such cooling arrays can raise a number of issues.

For example, fans of similar size and/or blade geometry may interact acoustically to provide unwanted noise in a system. This may occur whenever a first fan is operated at a speed that is close to the speed at which a second fan is operated, which can result in a "beating" noise that can be distracting to a user of the IHS. Current fan control schemes generally operate fans to optimize thermal performance at the lowest possible fan speed in order to reduce noise. However, such schemes typically do not anticipate the undesirable acoustic interaction that may occur between the fans.

Conventional solutions include operating the fans at different speeds and/or adjusting the fan operation in response to fan noise as measured by a microphone. Such solutions do not address the causes of the acoustic interactions that result in the unwanted noise, and can add unwanted costs.

Accordingly, it would be desirable to provide an improved control to address acoustic interactions between multiple fans absent the disadvantages discussed above.

SUMMARY

According to one embodiment, a fan control system includes a controller that is coupled to a plurality of fan couplers, and a computer-readable medium coupled to the controller. The computer-readable medium comprises a first fan identification corresponding to a first fan, a second fan identification corresponding to a second fan, and at least one fan property associated with each of the first fan identification and the second fan identification. The controller is operable to monitor at least one operating parameter of each of the first fan and the second fan when the first fan and the second fan are coupled to a respective fan coupler. The controller is further operable to use the at least one fan property associated with each of the first fan identification and the second fan identification and the at least one operating parameter of each of the first fan and the second fan in order to adjust a speed of the second fan relative to a speed of the first fan.

BRIEF DESCRIPTION OF THE DRAWINGS

FIG. 2b is a schematic view illustrating an embodiment of the fan control system of FIG. 2a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
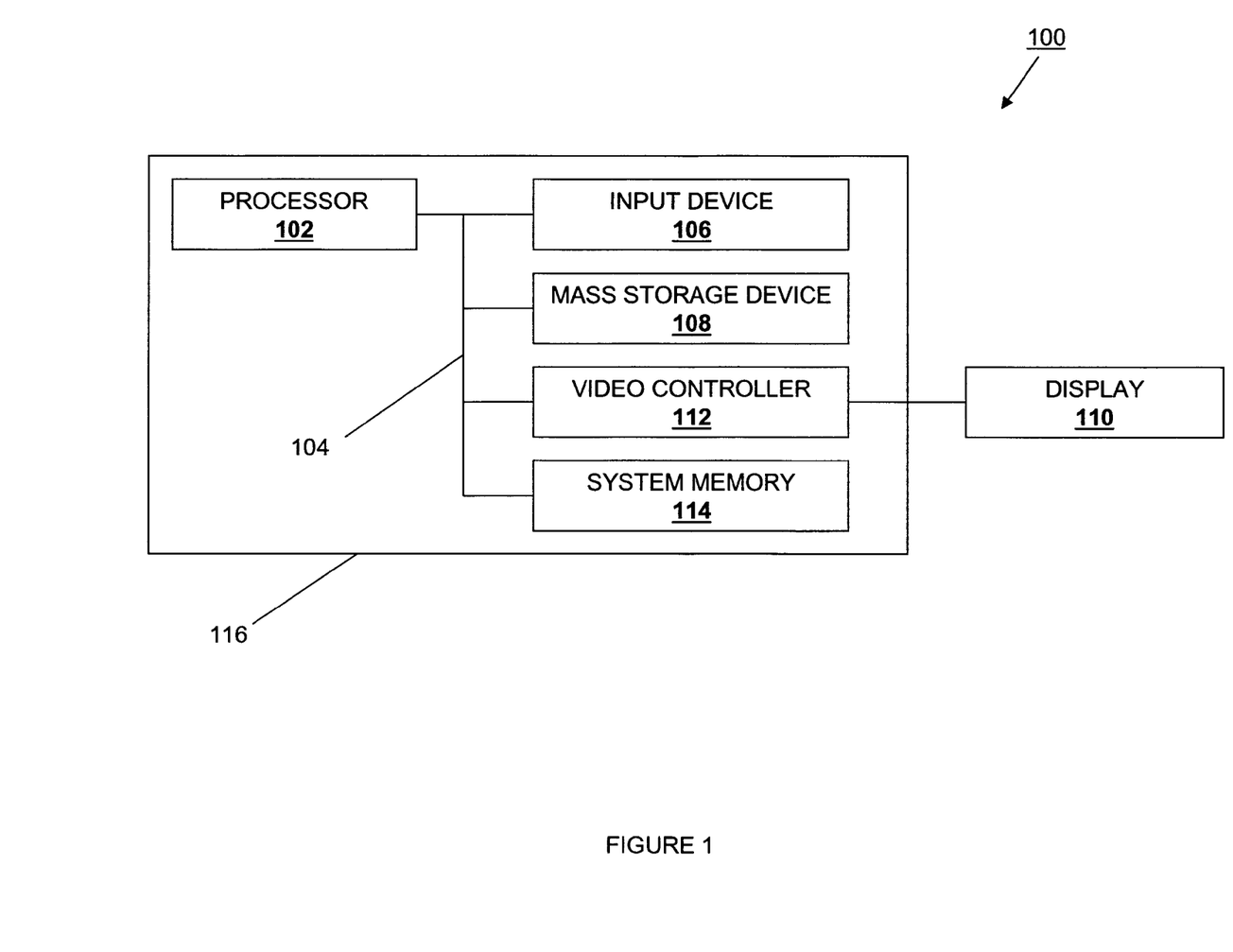
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
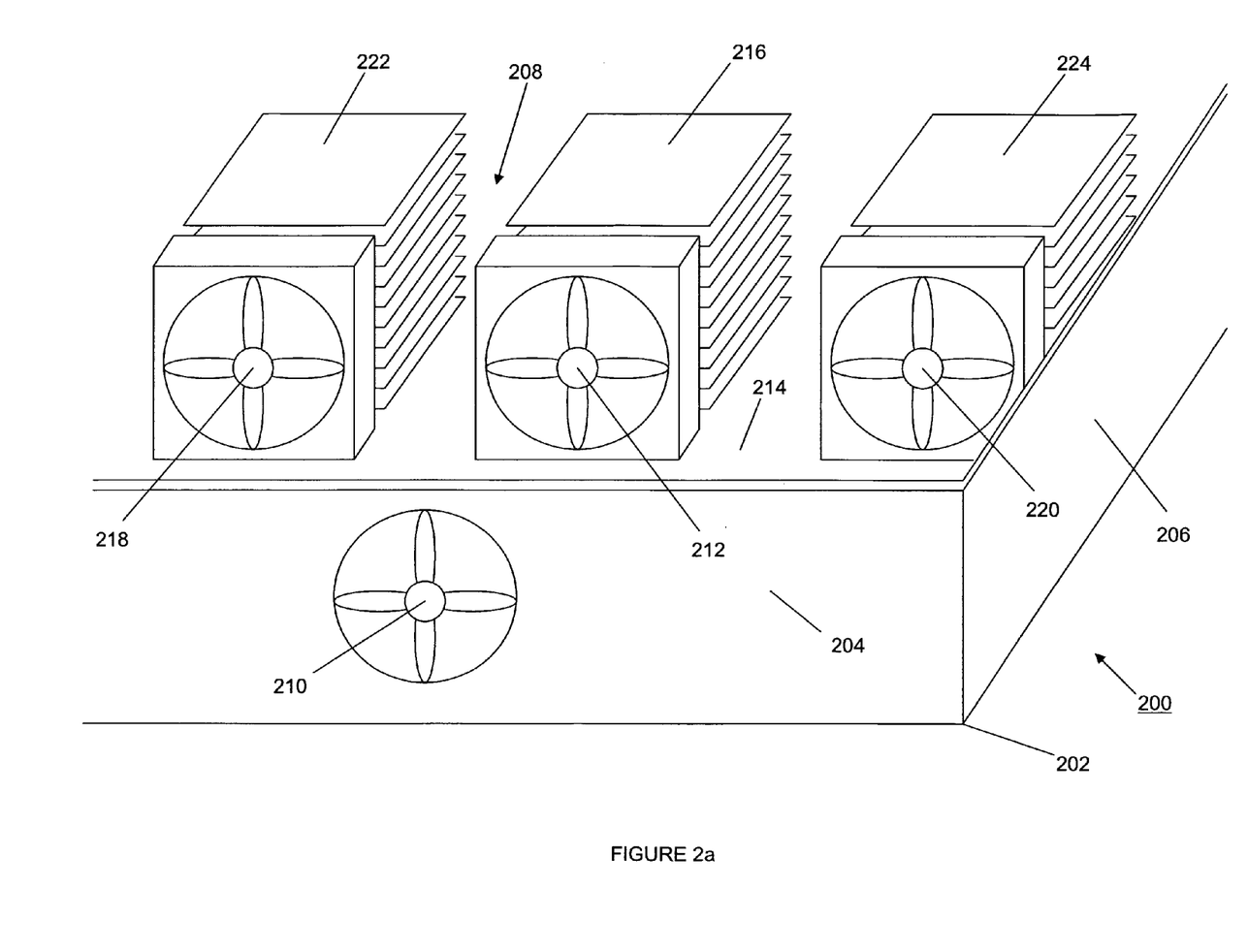
FIG. 2a is a perspective view illustrating an embodiment of a fan control system.

Referring now to FIG. 2a, an embodiment of an fan control system 200 is illustrated. In an embodiment, the fan control system 200 may be part of the IHS 100, described above with reference to FIG. 1. The fan control system 200 includes a chassis 202 which may be, for example, the chassis 116, described above with reference to FIG. 1, or which may be housed in the chassis 116. The chassis 202 includes a wall 204 and a wall 206 that define a chassis housing 208 between them. The wall 204 houses a fan 210 that is operable to either draw air from outside of the chassis 220 and direct the air into the chassis housing 208, or draw air from inside of the chassis housing 208 and direct the air outside of the chassis 202. A fan 212 is located in the chassis housing 208 and may be coupled to a board 214 that is mounted to the chassis 202. In an embodiment, the board 214 may include a variety of components for the IHS 100, described above with reference to FIG. 1, such as, for example, the processor 102. In the illustrated embodiment, a processor (not illustrated) is located adjacent the fan 212 and a heat dissipation device 216 is thermally coupled to the processor. In an embodiment, any number of additional fans such as, for example, a fan 218 and a fan 220, may be located in chassis housing 208. In the illustrated embodiment, heat dissipation device 222 and 224, are located adjacent the fans 218 and 220, respectively, and may provide heat dissipation for a variety of IHS components known in the art. In an embodiment, the heat dissipation devices 216, 222 and 224 may be replaced by IHS components such as, for example, memory devices, power supplies, and or a variety of other IHS components known in the art.

Figure 2B:
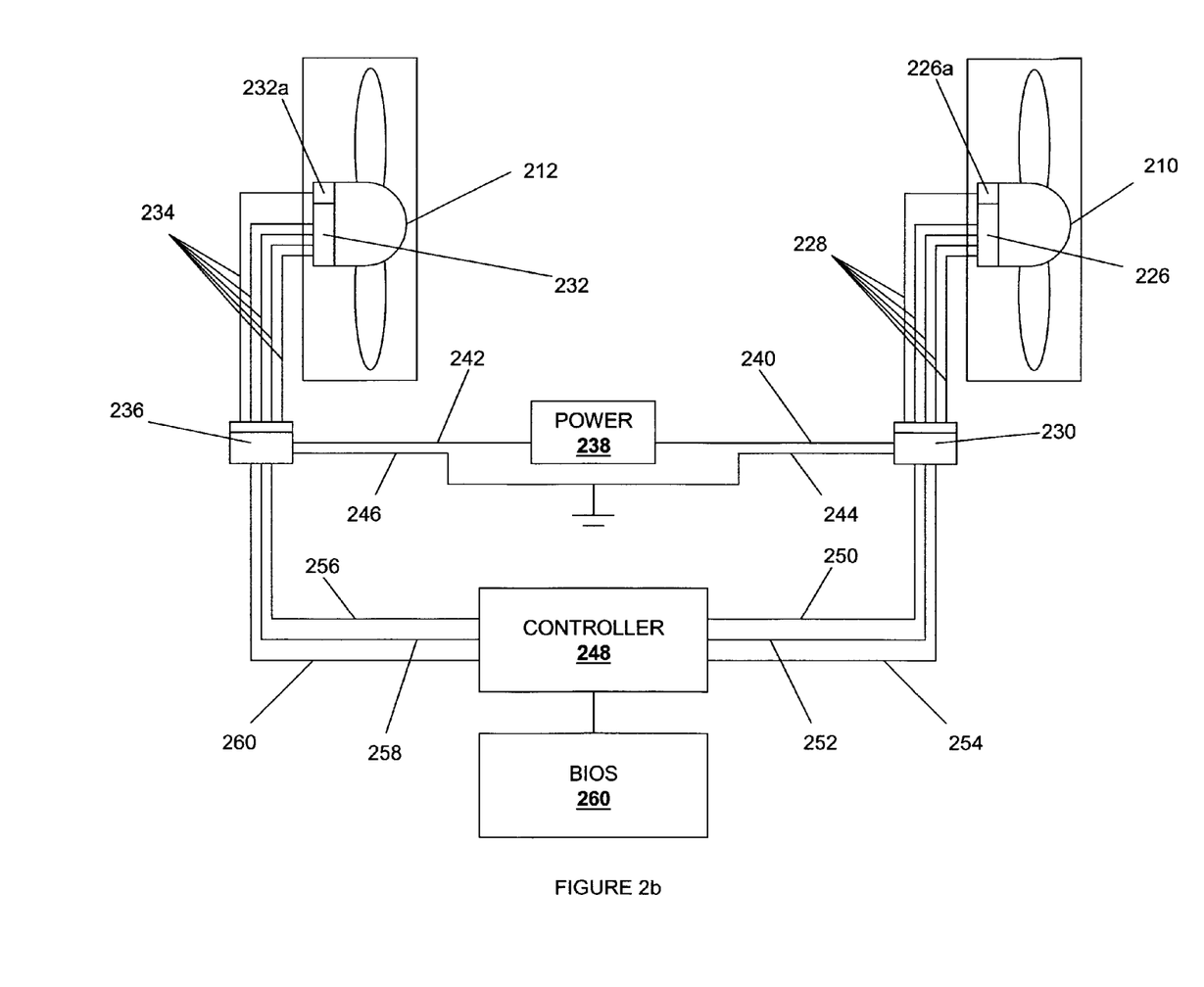

Referring now to FIG. 2b, the fan 210 includes a fan printed circuit board (PCB) 226 that is coupled to the fan 210 and that includes a fan identification circuit 226a. A plurality of electrical couplings 228 extend from the fan PCB 226 and the fan identification circuit 226a and include, for example, a fan ID coupling, a fan tachometer coupling, a fan power coupling, a fan ground coupling, a fan pulse width modulation (PWM) control coupling, and/or a variety of other electrical couplings known in the art. The electrical couplings 228 are coupled to a fan coupler 230 that may be located, for example, on the board 214, described above with reference to FIG. 2a. The fan 212 includes a fan PCB 232 that is coupled to the fan 212 and that includes a fan identification circuit 232a. A plurality of electrical couplings 234 extend from the fan PCB 232 and the fan identification circuit 232a and include, for example, a fan ID coupling, a fan tachometer coupling, a fan power coupling, a fan ground coupling, a fan PWM control coupling, and/or a variety of other electrical couplings known in the art. The electrical couplings 234 are coupled to a fan coupler 236 that may be located, for example, on the board 214, described above with reference to FIG. 2a. A power source 238 is coupled to a power coupling 240 that couples the power source 238 to the fan 210 through the fan coupler 230. The power source 238 is also coupled to a power coupling 242 that couples the power source 238 to the fan 212 through the fan coupler 230. A ground is coupled to a ground coupling 244 that couples the fan 210 to the ground through the fan coupler 230. The ground is also coupled to a ground coupling 246 that couples the ground to the fan 212 through the fan coupler 230. A controller 248 is coupled to a fan PWM control coupling 250, a fan tachometer coupling 252, and a fan identification coupling 254, each of which couple the controller 248 to the fan 210 through the fan coupler 230. The controller 248 is also coupled to a fan PWM control coupling 256, a fan tachometer coupling 258, and a fan identification coupling 260, each of which couple the controller 248 to the fan 212 through the fan coupler 230. In an embodiment, the controller 248 may be, for example, the processor 102 described above with reference to FIG. 1, a fan controller that is coupled to the processor 102, and/or a variety of other controllers known in the art. A basic input/output system (BIOS) 260 is coupled to the controller 248. In an embodiment, the BIOS 260 may be replaced by a computer-readable medium known in the art that is operable to store information, as will be described in further detail below. While FIG. 2b illustrates only the fans 210 and 212, one of skill in the art will recognize that any number of fans (e.g., the fans 218 and 220) may be coupled to the power supply 238, the ground, and/or the controller 248.

Figure 2C:
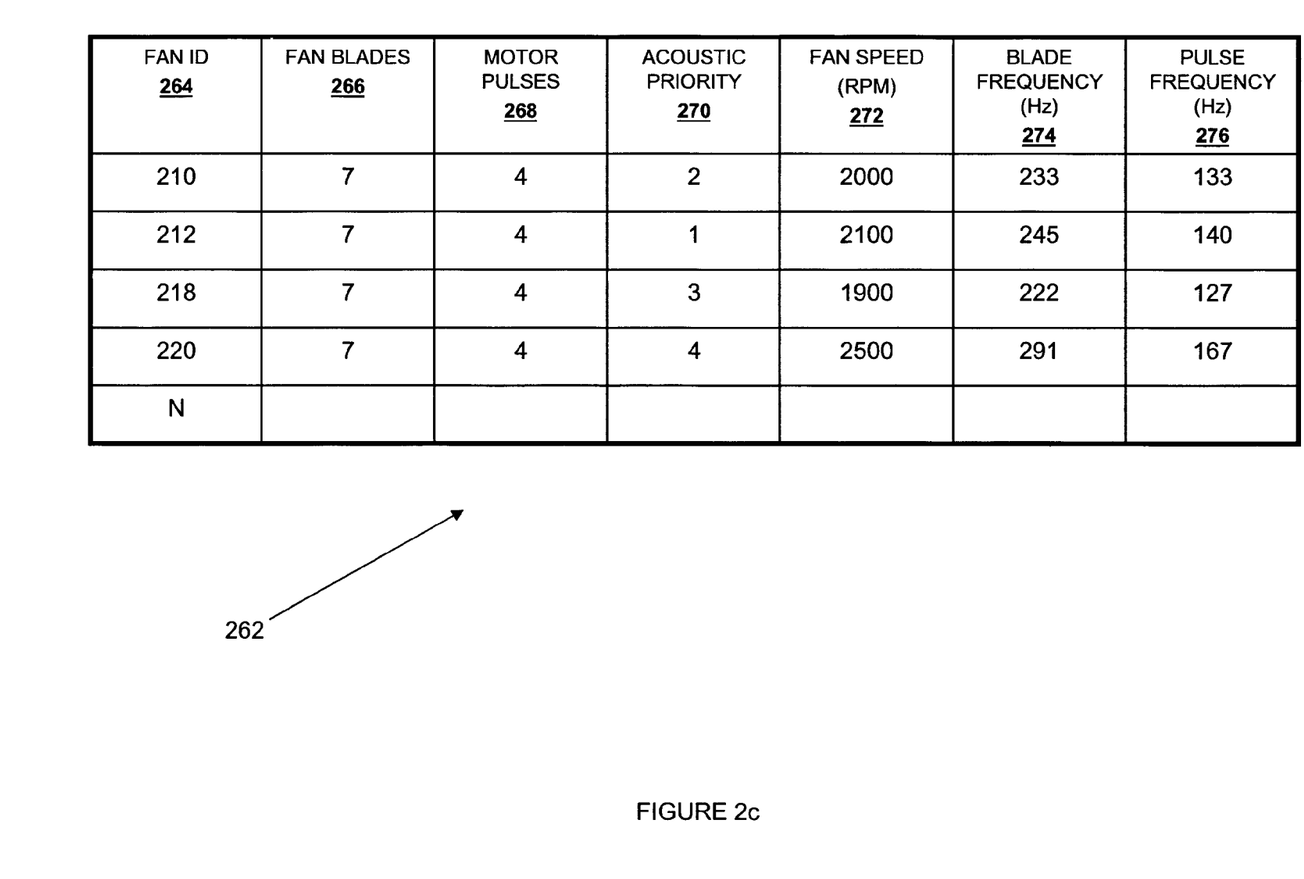
FIG. 2c is a table view illustrating a table used in the fan control system of FIGS. 2a and 2b.

Referring now to FIG. 2c, a table 262 is illustrated. In an embodiment, the table 262 may be included in the BIOS 260, described above with reference to FIG. 2b, in a computer-readable medium that is coupled to the controller 248, described above with reference to FIG. 2b, and/or in a variety of other locations known in the art that would be accessible to the controller 248. The table 262 includes a fan identification column 264, a fan blades column 266, a motor pulses column 268, an acoustic priority column 270, a fan speed column 272, a blade frequency column 274, and a pulse frequency column 276. The table 262 also includes a plurality of rows, each row which may include an identification of a fan (e.g., the fans 210, 212, 218 and/or 220) in the fan identification column 264, a number of blades on that fan in the fan blades column 266, a number of motor pulses of that fan in the motor pulses column 268, an acoustic priority given to that fan in the acoustic priority column 270, a speed at which that fan is operating in the fan speed column 272, a calculated blade frequency of that fan in the blade frequency column 274, and a calculated pulse frequency of that fan in the pulse frequency column 276. In an embodiment, the number of fan blades, the number of motor pulses, and the acoustic priority of any given fan may be referred to as a fan property of that fan. One of skill in the art will recognize a variety of other fan properties that fall within the scope of the present disclosure. In an embodiment, the speed at which a fan is operating may be referred to as a fan parameter of that fan. One of skill in the art will recognize a variety of other fan parameters that fall within the scope of the present disclosure.

Referring now to FIGS. 2a, 2b, 2c and 3, a method 300 for multiple fan acoustic interaction control is illustrated. The method 300 begins at block 302 where a first fan and a second fan that are coupled to a controller are provided. In an embodiment, the fan 210, the fan 212, and the controller 248 are provided. While the method 300 will be described as it applies to the fans 210 and 212, examples including additional fans (e.g., the fan 218 and the fan 220) will be provided, and one of skill in the art will recognize that the method 300 may be used with any number of fans. In an embodiment, each of the fans 210 and 212 may include a fan identification in the fan PCBs 226 and 232, respectively (e.g., located in the fan identification circuits 226a and 232a, respectively), that may be retrieved by the controller 248. The fan identification for each fan 210 and 212 may also be included in the table 262 in the fan identification column 264 (e.g., "210" and "212" in FIG. 2c).

Figure 3:
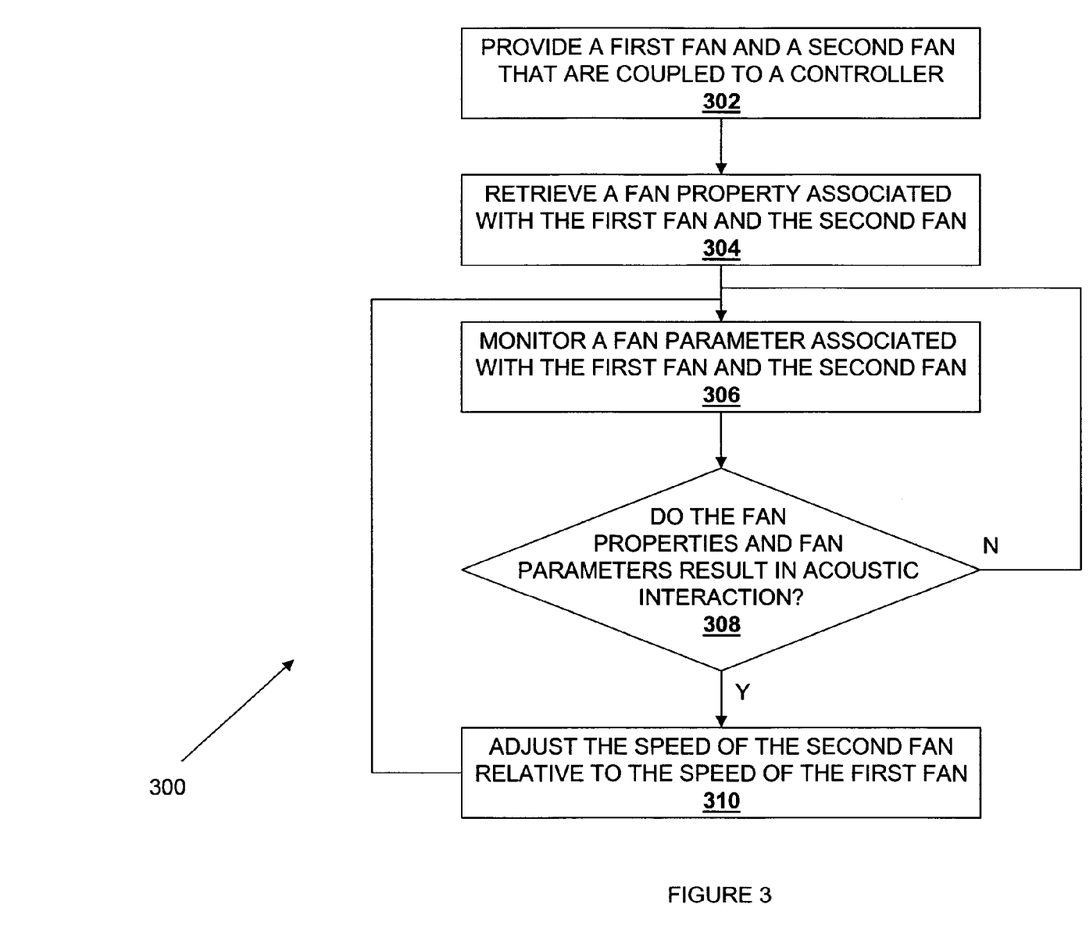
FIG. 3 is a flow chart illustrating an embodiment of a method for multiple fan acoustic interaction control.

The method 300 then proceeds to block 304 where a fan property associated with the first fan and a fan property associated with the second fan are retrieved. For each fan identification in the table 262, a fan property may be included in the fan blades column 266, in the motor pulses column 268, and in the acoustic priority column 270. For example, in the illustrated embodiment, the table 262 shows that the fan 210 is described in the top row of the table 262 (indicated by the "210" in the fan identification column 264) and includes 7 fan blades (indicated by the "7" in the fan blades column 266), 4 motor pulses (indicated by "4" in the motor pulses column 268), and has been given an acoustic priority of 2 (indicated by a "2" in the acoustic priority column 270). Likewise, the table 262 shows that the fan 212 includes 7 fan blades, 4 motor pulses, and has been given an acoustic priority of 1. The controller 248 may retrieve the fan identification of the fans 210 and 212 (e.g., from the fan PCBs 226 and 2322, respectively) and then access the table 262 to retrieve the number of fan blades, the number of motor pulses, and the acoustic priority for each of the fans 210 and 212.

The method 300 then proceeds to block 306 where a fan parameter associated with the first fan and a fan parameter associated with the second fan are monitored. The controller 248 may monitor the fan speed of each of the fans 210 and 212 through the fan tachometer couplings 252 and 258, respectively, as illustrated in the table 262, which indicates that the fan 210 is operating at 2000 RPM and the fan 212 is operating at 2100 RPM.

The method 300 then proceeds to decision block 308 where it is determined whether the fan properties and the fan parameters result in an acoustic interaction between the first fan and the second fan. The operation of multiple fans simultaneously can result in an undesirable acoustic interaction, sometimes referred to as a "beating" noise. This undesirable acoustic interaction may occur when blade frequencies and pulse frequencies of the fans are too close in value. The controller 248 uses the number of blades on the fans 210 and 212 and the number of motor pulses of the fans 210 and 212, retrieved in block 304 of the method 300, along with the fan speed of the fans 210 and 212, monitored in block 306 of the method 300, to calculate a blade frequency and a pulse frequency for each of the fans 210 and 212. In the illustrated embodiment, the blade frequency is determined by multiplying the number of fan blades of a fan by the fan speed of that fan, and the pulse frequency is determined by multiplying the number of motor pulses of a fan by the fan speed of that fan. For example, in the illustrated embodiment, the table 262 shows the fan 210 having a blade frequency of 233 Hz (indicated by the "233" in the blade frequency column 274) and a pulse frequency of 133 Hz (indicated by the "133" in the pulse frequency column 276). Likewise, the table 262 shows the fan 212 having blade frequency of 245 Hz and a pulse frequency of 140 Hz. The controller 248 may then compare the blade frequencies of the fans 210 and 212 and/or compare the pulse frequencies of the fans 210 and 212 and determine whether they are within a predetermined frequency difference of each other that may cause an undesirable acoustic interaction. In an embodiment, the predetermined frequency difference is 5 Hz. If the blade frequencies of the fans 210 and 212 and/or the pulse frequencies of the fans 210 and 212 are not within the predetermined frequency difference of each other, the method 300 returns to block 306 and continues to loop through blocks 306 and 308 to determine if an undesirable acoustic interaction is occurring.

If at decision block 308, the blade frequencies of the fans 210 and 212 and/or the pulse frequencies of the fans 210 and 212 are within the predetermined frequency difference of each other, the method 300 proceeds to block 310 where the speed of the second fan is adjusted relative to the speed of the first fan. Upon determining that the blade frequencies of the fans 210 and 212 and/or the pulse frequencies of the fans 210 and 212 are within the predetermined frequency difference of each other that may cause an undesirable acoustic interaction, the controller 248 determines the acoustic priority of the fan 210 and the acoustic priority of the fan 212. Acoustic priority may be assigned to each of the fans 210 and 212 before or during the method 300. In the illustrated embodiment, the table 262 shows that the fan 212 has an acoustic priority of "1" and the fan 210 has an acoustic priority of "2", and the controller 248 may interpret those acoustic priorities to mean that the fan 212 has acoustic priority over the fan 210. The controller 248 may then increase the speed of the fan 210 relative to the fan 212 until the calculated blade frequencies of the fans 210 and 212 and/or the calculated pulse frequencies of the fans 210 and 212 are no longer within the predetermined frequency difference of each other such that the acoustic interaction will not occur. The method 300 may then return to block 306 and continue to loop through blocks 306, 308 and/or 310 to determine if an undesirable acoustic interaction is occurring and, if so, adjust the fans speeds to correct it.

In an embodiment, the fan 210 has acoustic priority over the fan 212, described above, and the fan 210 operates at a minimum fan speed required for the particular cooling requirement for which it is being used. When the fan properties and the fan parameters of the fans 210 and 212 result in a condition in which there may be an undesirable acoustic interaction, the speed of the fan 212 is increased to stop the acoustic interaction or to prevent the occurrence of the acoustic interaction. One of skill in the art will recognize how such a scheme may be applied to multiple fans without departing from the scope of the present disclosure. For example, the table 262 shows the fan 218 (indicated by the "218" in the fan identification column 264) having 7 fan blades, 4 motor pulses, an acoustic priority of 3, and operating at a fan speed of 1900 RPM with a calculated blade frequency of 222 Hz and a calculated pulse frequency of 127 Hz. Likewise, the table 262 shows the fan 220 (indicated by the "220" in the fan identification column 264) having 7 fan blades, 4 motor pulses, an acoustic priority of 4, and operating at a fan speed of 2500 RPM with a calculated blade frequency of 291 Hz and a calculated pulse frequency of 167 Hz. In an embodiment, the speeds of the fans 210, 212, 218 and 220 are adjusted based on their acoustic priority. As such, in the illustrated embodiment, the fan 210 may operate at a minimum fan speed required for the particular cooling requirement for which it is being used, the speed of the fan 212 may be adjusted to prevent undesirable acoustic interaction with the fan 210, the speed of the fan 218 may be adjusted to limit or avoid undesirable acoustic interaction with the fan 212, and the speed of the fan 220 may be adjusted to limit or avoid undesirable acoustic interaction with the fan 218. In other embodiments, the present or absence of acoustic interactions between the fans 210, 212, 218 and 220 may be determined such that the speeds of the fans 210, 212, 218 and 220 may be adjusted simultaneously. In another embodiment, the fans may be temperature controlled, and upon determining that the blade frequencies and/or the pulse frequencies are within the predetermined frequency difference of each other, the controller 248 may utilize a temperature offset register that it may adjust in order to adjust the fan speed of a fan (e.g., by adjusting the temperature that the fan "sees" in order to adjust its speed) to prevent limit or avoid the blade frequencies and/or the pulse frequencies of the fans from being within the predetermined frequency difference of each other in order to avoid the acoustic interaction. Thus, a multiple fan acoustic interaction control is provided that adjusts relative fan speeds based on cooling priorities in order to remedy undesirable acoustic interactions between the fans.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A fan control system, comprising:
a controller that is coupled to a plurality of fan couplers; and
a computer-readable medium coupled to the controller, the computer-readable medium comprising a first fan identification corresponding to a first fan, a second fan identification corresponding to a second fan, and at least one fan property associated with each of the first fan identification and the second fan identification;
wherein the controller is operable to monitor at least one operating parameter of each of the first fan and the second fan when the first fan and the second fan are coupled to a respective fan coupler, and wherein the controller is further operable to use the at least one fan property associated with each of the first fan identification and the second fan identification and the at least one operating parameter of each of the first fan and the second fan in order to calculate a blade frequency for each of the first fan and the second fan, and wherein the controller is operable to increase the speed of the second fan relative to the speed of the first fan if the calculated blade frequency of the second fan is within a predetermined frequency difference of the calculated blade frequency of the first fan.

2. The fan control system of claim 1, wherein the at least one fan property associated with each of the first fan identification and the second fan identification comprises a first acoustic priority associated with the first fan identification and a second acoustic priority associated with the second fan identification, and wherein the speed of the second fan is increased relative to the speed of the first fan according to the first acoustic priority and the second acoustic priority.

3. The fan control system of claim 1, wherein the at least one fan property associated with each of the first fan identification and the second fan identification comprises a number of blades on the first fan and a number of blades on the second fan.

4. The fan control system of claim 1, wherein the controller is operable to increase the speed of the second fan relative to the speed of the first fan by adjusting a temperature offset register.

5. A fan control system, comprising:
a controller that is coupled to a plurality of fan couplers; and
a computer-readable medium coupled to the controller, the computer-readable medium comprising a first fan identification corresponding to a first fan, a second fan identification corresponding to a second fan, and at least one fan property associated with each of the first fan identification and the second fan identification;
wherein the controller is operable to monitor at least one operating parameter of each of the first fan and the second fan when the first fan and the second fan are coupled to a respective fan coupler, and wherein the controller is further operable to use the at least one fan property associated with each of the first fan identification and the second fan identification and the at least one operating parameter of each of the first fan and the second fan in order to calculate a pulse frequency for each of the first fan and the second fan, and wherein the controller is operable to increase the speed of the second fan relative to the speed of the first fan if the calculated pulse frequency of the second fan is within a predetermined frequency difference of the calculated pulse frequency of the first fan.

6. The fan control system of claim 5, wherein the at least one fan property associated with each of the first fan identification and the second fan identification comprises a first acoustic priority associated with the first fan identification and a second acoustic priority associated with the second fan identification, and wherein the speed of the second fan is increased relative to the speed of the first fan according.

7. The fan control system of claim 5, wherein the at least one fan property associated with each of the first fan identification and the second fan identification comprises a number of motor pulses of the first fan and a number of motor pulses of the second fan.

8. The fan control system of claim 5, wherein the controller is operable to increase the speed of the second fan relative to the speed of the first fan by adjusting a temperature offset register.

9. An information handling system (IHS), comprising:
a processor;
a fan controller coupled to the processor;
a first fan and a second fan coupled to the fan controller; and
a basic input/output system (BIOS) coupled to the fan controller, the BIOS comprising a first fan identification corresponding to the first fan, a second fan identification corresponding to the second fan, and at least one fan property associated with each of the first fan identification and the second fan identification;
wherein the fan controller is operable to monitor at least one operating parameter of each of the first fan and the second fan, and wherein the fan controller is further operable to use the at least one fan property associated with each of the first fan identification and the second fan identification and the at least one operating parameter of each of the first fan and the second fan in order to calculate a blade frequency for each of the first fan and the second fan, and wherein the controller is operable to increase the speed of the second fan relative to the speed of the first fan if the calculated blade frequency of the second fan is within a predetermined frequency difference of the calculated blade frequency of the first fan.

10. The IHS of claim 9, wherein the at least one fan property associated with each of the first fan identification and the second fan identification comprises a first acoustic priority associated with the first fan identification and a second acoustic priority associated with the second fan identification, and wherein the speed of the second fan is adjusted-increased relative to the speed of the first fan according to the first acoustic priority and the second acoustic priority.

11. The IHS of claim 9, wherein the at least one fan property associated with each of the first fan identification and the second fan identification comprises a number of blades on the first fan and a number of blades on the second fan.

12. The IHS of claim 9, wherein the controller is operable to increase the speed of the second fan relative to the speed of the first fan by adjusting a temperature offset register.

13. An information handling system (IHS), comprising:
a processor;
a fan controller coupled to the processor;
a first fan and a second fan coupled to the fan controller; and
a basic input/output system (BIOS) coupled to the fan controller, the BIOS comprising a first fan identification corresponding to the first fan, a second fan identification corresponding to the second fan, and at least one fan property associated with each of the first fan identification and the second fan identification;

wherein the fan controller is operable to monitor at least one operating parameter of each of the first fan and the second fan, and wherein the fan controller is further operable to use the at least one fan property associated with each of the first fan identification and the second fan identification and the at least one operating parameter of each of the first fan and the second fan in order to calculate a pulse frequency for each of the first fan and the second fan, and wherein the controller is operable to increase the speed of the second fan relative to the speed of the first fan if the calculated pulse frequency of the second fan is within a predetermined frequency difference of the calculated pulse frequency of the first fan.

14. The IHS of claim 13, wherein the at least one fan property associated with each of the first fan identification and the second fan identification comprises a first acoustic priority associated with the first fan identification and a second acoustic priority associated with the second fan identification, and wherein the speed of the second fan is increased relative to the speed of the first fan according to the first acoustic priority and the second acoustic priority.

15. The IHS of claim 13, wherein the at least one fan property associated with each of the first fan identification and the second fan identification comprises a number of motor pulses of the first fan and a number of motor pulses of the second fan.

16. The IHS of claim 13, wherein the fan controller is operable to increase the speed of the second fan relative to the speed of the first fan by adjusting a temperature offset register.

17. A method for multiple fan acoustic interaction control, comprising:

providing a first fan and a second fan coupled to a controller;

retrieving at least one fan property associated with each of the first fan and the second fan;

monitoring at least one fan parameter of each of the first fan and the second fan;

calculating a blade frequency for each of the first fan and the second fan using the at least one fan property associated with each of the first fan and the second fan and the at least one fan parameter of each of the first fan and the second fan, and increasing a speed of the second fan relative to a speed of the first fan in response to determining that the calculated blade frequency of the second fan is within a predetermined frequency difference of the calculated blade frequency of the first fan.

18. The method of claim 17, wherein the at least one fan property of each of the first fan and the second fan comprises a first acoustic priority associated with the first fan and a second acoustic priority associated with the second fan, and wherein the increasing the speed of the second fan relative to the speed of the first fan further comprises:

determining that the first acoustic priority has priority over the second acoustic priority and, in response, increasing the speed of the second fan relative to the first fan.

19. A method for multiple fan acoustic interaction control, comprising:

providing a first fan and a second fan coupled to a controller;

retrieving at least one fan property associated with each of the first fan and the second fan;

monitoring at least one fan parameter of each of the first fan and the second fan;

calculating a pulse frequency for each of the first fan and the second fan using the at least one fan property associated with each of the first fan and the second fan and the at least one fan parameter of each of the first fan and the second fan; and increasing a speed of the second fan relative to a speed of the first fan in response to determining that the calculated pulse frequency of the second fan is within a predetermined frequency difference of the calculated pulse frequency of the first fan.

20. The method of claim 19, wherein the at least one fan property of each of the first fan and the second fan comprises a first acoustic priority associated with the first fan and a second acoustic priority associated with the second fan, and wherein the increasing the speed of the second fan relative to the speed of the first fan further comprises:

determining that the first acoustic priority has priority over the second acoustic priority and, in response, increasing the speed of the second fan relative to the first fan.

21. The method of claim 19, wherein the first fan has an acoustic priority and operates at a minimum speed required for thermal cooling, and the second fan is adjusted to increase speed as required to limit acoustic noise resulting from simultaneously operating the first and second fans.

* * * * *